United States Patent
Chen

(10) Patent No.: US 8,088,490 B2
(45) Date of Patent: Jan. 3, 2012

(54) VARNISH, PREPREG, AND SUBSTRATE THEREOF

(75) Inventor: Li-Chun Chen, Taoyuan (TW)

(73) Assignee: Iteq Corporation, Taoyuan (TW)

( * ) Notice: Subject to any disclaimer, the term of this patent is extended or adjusted under 35 U.S.C. 154(b) by 180 days.

(21) Appl. No.: 12/605,368

(22) Filed: Oct. 25, 2009

(65) Prior Publication Data

US 2011/0097587 A1    Apr. 28, 2011

(51) Int. Cl.
 *B32B 27/38* (2006.01)
 *B32B 27/04* (2006.01)
 *C08L 63/00* (2006.01)
 *C08K 3/22* (2006.01)
 *C08K 3/36* (2006.01)
 *C08K 5/49* (2006.01)

(52) U.S. Cl. ............... 428/413; 428/297.4; 428/901; 523/427; 523/433; 523/451; 523/457; 523/466; 525/524; 525/525; 525/538

(58) Field of Classification Search ........... 428/297.4, 428/413, 414, 415, 416, 417, 418, 901; 523/400, 523/427, 438, 451, 457, 466; 525/523, 524, 525/525, 538

See application file for complete search history.

(56) References Cited

U.S. PATENT DOCUMENTS

| 2002/0119317 A1* | 8/2002 | Gan et al. ............ 428/413 |
| 2006/0160931 A1* | 7/2006 | Jung et al. .......... 523/427 |

FOREIGN PATENT DOCUMENTS

JP    2004115745 A  *  4/2004

OTHER PUBLICATIONS

Machine translation of JP 2004115745 A, provided by the JPO website (no date).*

* cited by examiner

*Primary Examiner* — Michael J Feely
(74) *Attorney, Agent, or Firm* — Pai Patent & Trademark Law Firm; Chao-Chang David Pai

(57) ABSTRACT

A halogen-free varnish includes (A) resin, (B) curing agent, (C) flame inhibitor (flame-retarding agent), (D) accelerator and (E) additives. Resin of (A) has novolac epoxy resin, DOPO-CNE and DOPO-HQ-CNE. Curing agent of (B) includes Benzoxazine resin and phenol novolac resin. Glass fabric cloth is dipped into the halogen-free varnish so as to form a prepreg with better thermal stability, anti-flammability, low absorbent ability and higher curing rate. Furthermore, the prepreg has more toughness.

11 Claims, No Drawings

VARNISH, PREPREG, AND SUBSTRATE THEREOF

BACKGROUND OF THE INVENTION

1. Field of the Invention

The present invention relates to a varnish and a prepreg, in particular, to a halogen-free varnish with composite main resin having two kinds of phosphorus-containing novolac epoxy mixed with a bisphenol—A novolac epoxy resin, a prepreg made from the varnish, and a substrate made from prepregs.

2. Description of Related Art

The printed circuit board (PCB) is widely used in many applications and fields, for example, electronic cards are inserted on PCBs. Thus, PCBs are known as a base of the electronic industry. Therefore, study and research on quality of PCBs is in order to improve the performance of electronic devices.

A PCB is made by pressing the prepregs, and copper clad laminate (CCL), or copper film together. The prepregs are made by dipping glass fabrics into varnish and then curing the resin on the fabrics to form thin prepregs.

Regarding environmental protection, halogen-free PCB's are generally becoming more and more developed for electronic applications. Phosphorus-containing compounds are usually added into the halogen-free PCB for enhancing the anti-flammability, or fire-retardancy of the PCB. Traditionally, the varnish can contain either primary resin with a phosphorus-containing compound "pcc" or curing agent with phosphorus-containing compound (pcc). Alternatively, a phosphorus-containing-compound may be added into the varnish for improving the anti-flammability of the PCB.

For example, the traditional varnish contains a single phosphorus-containing compound known as HCA (9,10-dihydro-a-oxa-10-phosphenanthrene-10-oxide) for improving the anti-flammability of the prepregs/PCBs. However, the toughness properties of the PCBs made by the traditional resin with a single phosphorus-containing compound cannot meet the requirements for electronic products.

Consequently, relating to the resolution of improvable defects illustrated hereinbefore, the inventors of the present invention have designed and now offer a well-designed solution for effectively eliminating such defects.

SUMMARY OF THE INVENTION

The primary object of the present invention is to provide a halogen-free varnish for PCB and other electronic applications. The varnish contains a main resin which includes a bisphenol—A novolac epoxy resin and two kinds of phosphorus-containing novolac epoxy. The halogen-free varnish is provided for increasing Tg of the prepreg. Furthermore, the prepregs made by the varnish have characteristics of anti-flammability or flame retardancy, being heatproof, and having low moisture absorption. In addition, the prepregs have improved toughness.

To achieve the above-mentioned objective, the present invention provides a varnish. The varnish includes composition (A): epoxy resin which has a bisphenol—A novolac epoxy resin, a first phosphorus-containing novolac epoxy and a second phosphorus-containing novolac epoxy; and composition (B): curing agent, wherein the curing agent includes a benzoxazine resin and a phenol novolac resin; composition (C): flame-retarding agent; composition (D): accelerator; and composition (E): fillers.

The present invention provides a prepreg which is manufactured by dipping the glass fabrics into the varnish and then curing and drying the dipped fabrics.

The present invention further provides a substrate by laminating the prepreg into the substrate of PCB.

Two kinds of phosphorus-containing novolac epoxy are mixed with a bisphenol—A novolac epoxy resin as a composite epoxy resin. The composite epoxy resin is distributed in the halogen-free varnish so as to increase the curing reaction rate of the dipped fabrics. The toughness of the prepregs manufactured by dipping glass fabrics into the varnish is improved by choosing the suitable ratio of the two phosphorus-containing novolac epoxy resins (epoxies).

In order to further understand the techniques, means, and effects the present invention takes for achieving the prescribed objectives, the following detailed description and appended drawings are hereby provided for and made of reference such that, through which, the purposes, features, and aspects of the present invention can be thoroughly and concretely appreciated; however, these drawings are provided solely for reference and illustration, without any intention for their use in limiting the present invention.

DETAILED DESCRIPTION OF THE PREFERRED EMBODIMENTS

The present invention provides a halogen-free, yet flame-retardant varnish. The varnish has: composition (A): a resin, composition (B): a curing agent, composition (C): a flame-retarding agent, composition (D): an accelerator, and composition (E): fillers. The flame-retarding property and glass transition temperature (Tg) of the substrate made by the varnish are improved. The weight ratio of the resins of composition (A) is being further studied to improve at least the heatproof property, anti-flammability, toughness and Tg of the laminate. Moreover, fillers are added into the varnish for obtaining higher heatproof properties, greater flame resistance. Higher dimensional stability, and the anti-flammability.

Composition (A) has a bisphenol—A novolac epoxy resin, a first phosphorus-containing novolac epoxy and a second phosphorus-containing novolac epoxy. By adjusting the ratio of the first phosphorus-containing novolac epoxy and the second phosphorus-containing novolac epoxy, or the weight ratio of the first phosphorus-containing novolac epoxy and the second phosphorus-containing novolac epoxy of composite (A) and the bisphenol—A novolac epoxy resin of composite (A), the toughness of the lamination has been increased. Furthermore, the low heatproof property issue and the issue of the increasing moisture absorption are solved.

The first phosphorus-containing novolac epoxy is a side chain phosphorus-containing novolac epoxy. In the embodiment, the first phosphorus-containing novolac epoxy is an o-cresol novolac epoxy resin (CNE) linked with an organic ring in which one vertex of the ring is occupied, or formed by a phosphorus atom. For example, the side chain phosphorus-containing novolac epoxy is an o-cresol novolac epoxy resin linked with 9,10-dihydro-9-oxa-10-Phosphaphenanthrene-10-oxide (DOPO). The above-mentioned DOPO is shown by formula 1:

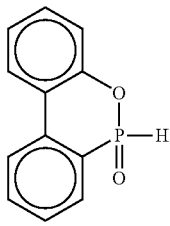

formula 1

Therefore the first phosphorus-containing novolac epoxy is a phosphorus-containing material modified by the DOPO and the first phosphorus-containing novolac epoxy is named as DOPO-CNE.

On the other hand, the second phosphorus-containing novolac epoxy is a novolac epoxy resin linked with an organic ring in which one vertex of the ring is occupied, or formed by a phosphorus atom. In the embodiment, the second phosphorus-containing novolac epoxy is an o-cresol novolac epoxy resin (CNE) linked with an organic ring in which one vertex of the ring is occupied, or formed by a phosphorus atom. For example, the second phosphorus-containing novolac epoxy is an o-cresol novolac epoxy resin linked with 10-(2,5-dihydroxyphenyl)-10h-9 oxa-10-phosphaphenanthrene-10-oxide (DOPO-HQ). The DOPO-HQ is shown by formula 2:

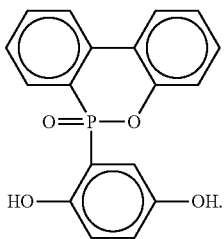

formula 2

The second phosphorus-containing novolac epoxy is a phosphorus-containing material modified by the DOPO-HQ and the second phosphorus-containing novolac epoxy is named as DOPO-HQ-CNE.

Composition (B) includes a benzoxazine resin (Bz) and a phenol novolac resin. The Bz resin is shown by formula 3:

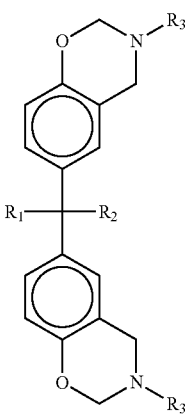

formula 3

In formula 3, R1, R2 are methyl or ethyl, R3 is a benzene ring, methyl or ethyl.

In addition, the flame-retarding agent of composite (C) is a phosphorus-containing epoxy, for example, the aryl condensed phosphate. The flame-retarding agent is added in the varnish to improve the heatproof property and the flame-retarding property of the prepregs and the laminations.

In the embodiment, the accelerator of the composition (D) is an isimidazole compound, for example, 1,2-Dimethyl Imidazole to control and to accelerate the curing of the varnish.

The varnish further has composition (E): fillers which include aluminium hydroxide, silica ($SiO_2$), or a mixture of aluminium hydroxide and silica.

The varnish further has composition (F): solvents which include one of or more than one of methyl ethyl ketone (MEK), propylene glycol monomethyl ether (PM), and cyclohexanone.

The following experiments are shown and the compositions of the varnish are discussed.

TABLE 1

| Compositions | Test 1 | Test 3 | Embodiment 2 | Embodiment 1 | Embodiment 3 | Test 4 | Test 2 |
|---|---|---|---|---|---|---|---|
| A-1. bisphenol - A novolac epoxy resin | 4.95% | 4.95% | 4.95% | 4.95% | 4.95% | 4.95% | 4.95% |
| A-2. DOPO-CNE | 3.00% | 2.50% | 2.00% | 1.50% | 1.00% | 0.50% | 0.00% |
| A-3. DOPO-HQ-CNE | 1.95% | 2.45% | 2.95% | 3.45% | 3.95% | 4.45% | 4.95% |
| B-1. BZ resin | 16.55% | 16.55% | 16.55% | 16.55% | 16.55% | 16.55% | 16.55% |
| B-2. phenol novolac resin | 4.40% | 4.40% | 4.40% | 4.40% | 4.40% | 4.40% | 4.40% |
| C. aryl condensed phosphate | 4.15% | 4.15% | 4.15% | 4.15% | 4.15% | 4.15% | 4.15% |
| D. 1,2-Dimethyl imidazole | 0.01% | 0.01% | 0.01% | 0.01% | 0.01% | 0.01% | 0.01% |
| E-1. silica | 9.25% | 9.25% | 9.25% | 9.25% | 9.25% | 9.25% | 9.25% |
| E-2. aluminium hydroxide | 5.75% | 5.75% | 5.75% | 5.75% | 5.75% | 5.75% | 5.75% |
| F-1. MEK | 44.28% | 44.28% | 44.28% | 44.28% | 44.28% | 44.28% | 44.28% |
| F-2. Cyclohexanone | 5.17% | 5.17% | 5.17% | 5.17% | 5.17% | 5.17% | 5.17% |
| F-3. PM | 0.54% | 0.54% | 0.54% | 0.54% | 0.54% | 0.54% | 0.54% |
| moisture absorption %(PCT) | 0.13 | 0.14 | 0.15 | 0.16 | 0.21 | 0.26 | 0.35 |
| Peeling strength(kN/m) | 1.7 | 1.6 | 1.6 | 1.5 | 1.5 | 1.5 | 1.4 |
| Float 288° C., sec | 600 | 600 | 600 | 600 | 550 | 530 | 475 |
| Tg(DMA), ° C. | 182.1 | 181.3 | 178.8 | 175.8 | 175.8 | 159.8 | 153.2 |
| Dk (1 GHz) | 4.56 | 4.55 | 4.54 | 4.54 | 4.58 | 4.54 | 4.57 |
| Df (1 GHz) | 0.008 | 0.007 | 0.008 | 0.007 | 0.008 | 0.008 | 0.008 |

TABLE 1-continued

| Compositions | Test 1 | Test 3 | Embodiment 2 | Embodiment 1 | Embodiment 3 | Test 4 | Test 2 |
|---|---|---|---|---|---|---|---|
| Toughness | bad | bad | good | good | better | better | better |
| UL94 | V-0 | V-0 | V-0 | V-0 | V-0 | V-0 | V-0 |

Please refer to Table.1; the ratio of the DOPO-CNE and DOPO-HQ-CNE is discussed. Depending on the different ratio of DOPO-CNE and DOPO-HQ-CNE, the properties of moisture absorption, solder float resistance, and anti-flammability are tested. The moisture absorption is determined by the water or moisture within the prepregs. The moisture absorption of the prepregs has to be controlled for preventing the situation of de-lamination. In general, the prepregs are inspected by IR or thermogravimetric analysis so as to show the degree of moisture absorption.

The result of solder float resistance: the test follows the instruction of IPC-TM-650 Method 2.4.13.1. The method tests heat-dissipation prepregs in 288° C. and counts the time when the prepregs has failed (De-lamination). The longer time period of the De-lamination presents that the prepregs/substrate has better heatproof property.

The test of anti-flammability (flame-retarding property) follows the instruction of UL 94 method. According to the degree of the anti-flammability, the testing results are rated as HB, V-2, V-1, V-0, and 5V so as to represent the anti-flammability of prepregs. The testing prepreg is burned on the fire vertically and follows the following steps. Step 1 is burning the prepreg in fire for 10 seconds and then moving the prepreg away, and simultaneously counting the time period (T1) that the prepreg continues to burn after being removed from the fire. Step 2 is burning the prepreg in fire for 10 seconds again, then moving the prepreg away and simultaneously counting the time period (T2) that the prepreg continues to burn after being removed from the fire. Step 3 is repeating the steps 1 and 2, and calculating the mean value of T1 and T2. Step 4 is summing T1 and T2. According to the specific definition of UL 94, V-0, neither of the mean value of T1 and T2 is larger than 10 seconds, and the sum of T1 and T2 is no greater than 50 seconds. Therefore, the prepregs of examples 1, 2 and embodiment 1 having achieved the standard for V-0 are thus marked as UL 94, V-0.

The doping of DOPO-HQ in CNE can result in the higher toughness of the prepregs/substrates, but results in the higher moisture absorption. Therefore, the amount of the doping of DOPO-HQ has to be controlled. Please refer to Test 2 and Test 4 in Table. 1; the composition of Test 2 only has DOPO-HQ-CNE (i.e., no DOPO-CNE) and the moisture absorption is 0.35. The ratio of DOPO-CNE and DOPO-HQ-CNE in Test 4 is 0.11, and the moisture absorption is still as high as 0.26. On the other hand, the ratio results in the lower Tg of the prepregs/substrates. Therefore, the amount of DOPO-HQ-CNE has to be controlled less than a maximum limit. In other words, the ratio of DOPO-CNE and DOPO-HQ-CNE has to be controlled higher than 0.11. However, the ratios of DOPO-CNE and DOPO-HQ-CNE are respectively 1.54 and 1.02 in Test 1 and Test 3 (i.e., very small amount of DOPO-HQ-CNE), and the toughness of the prepregs/substrates can not be improved. Therefore, the amount of DOPO-HQ-CNE has to be controlled higher than a minimum limit. In other words, the ratio of DOPO-CNE and DOPO-HQ-CNE has to be controlled smaller than 1.02.

According to Embodiments 1 to 3 (i.e., the ratio of DOPO-CNE and DOPO-HQ-CNE is 0.43, 0.68 and 0.25, respectively), the toughness of the prepregs/substrates can be efficiently improved and the moisture absorption is controlled from 0.15 to 0.21. Furthermore, the results of the anti-flammability (flame-retarding property) of the prepregs/substrates are acceptable. Accordingly, when the ratio of DOPO-CNE and DOPO-HQ-CNE is between 0.25 and 0.68, inclusive, the overall property of moisture absorption, anti-flammability, toughness, and Tg of prepregs/substrates demonstrates the most balanced improvement. Accordingly, from the experimental results of embodiments 1 to 3, it is concluded that the preferable weight ratio between DOPO-CNE and DOPO-HQ-CNE ranges between 0.29 and 0.43, inclusive.

TABLE 2

| compositions | Test 5 | Embodiment 4 | Embodiment 1 | Embodiment 5 | Test 6 |
|---|---|---|---|---|---|
| A-1. bisphenol - A novolac epoxy resin | 3.30% | 4.10% | 4.95% | 5.75% | 6.60% |
| A-2. DOPO-CNE | 2.00% | 1.75% | 1.50% | 1.25% | 1.00% |
| A-3. DOPO-HQ-CNE | 4.60% | 4.05% | 3.45% | 2.90% | 2.30% |
| B-1. BZ resin | 16.55% | 16.55% | 16.55% | 16.55% | 16.55% |
| B-2. phenol novolac resin | 4.40% | 4.40% | 4.40% | 4.40% | 4.40% |
| C.. aryl condensed phosphate | 4.15% | 4.15% | 4.15% | 4.15% | 4.15% |
| D. 1,2-Dimethyl imidazole | 0.01% | 0.01% | 0.01% | 0.01% | 0.01% |
| E-1. silica | 9.25% | 9.25% | 9.25% | 9.25% | 9.25% |
| E-2. aluminium hydroxide | 5.75% | 5.75% | 5.75% | 5.75% | 5.75% |
| F-1. MEK | 44.28% | 44.28% | 44.28% | 44.28% | 44.28% |
| F-2. Cyclohexanone | 5.17% | 5.17% | 5.17% | 5.17% | 5.17% |
| F-3. PM | 0.54% | 0.54% | 0.54% | 0.54% | 0.54% |
| moisture absorption % (PCT) | 0.21 | 0.17 | 0.16 | 0.16 | 0.15 |
| Peeling strength (kN/m) | 1.3 | 1.4 | 1.5 | 1.6 | 1.7 |
| Float 288° C., sec | 580 | 600 | 600 | 590 | 563 |
| Tg (DMA), ° C. | 165.1 | 174.8 | 175.8 | 176.8 | 178 |
| Dk (1 GHz) | 4.56 | 4.54 | 4.54 | 4.58 | 4.57 |
| Df (1 GHz) | 0.008 | 0.008 | 0.007 | 0.008 | 0.008 |
| toughness | better | Better | good | good | bad |
| UL94 | V-0 | V-0 | V-0 | V-0 | V-1 |

Please refer to Table.2; the ratios of the DOPO-CNE and DOPO-HQ-CNE of Embodiments 1, 4, 5 and Tests 5, 6 are 0.43. The ratio of the sum of DOPO-CNE and DOPO-HQ-CNE and the bisphenol—A novolac epoxy resin is discussed. In Test 5, the weight ratio of the first phosphorus-containing novolac epoxy (DOPO-CNE) and the second phosphorus-containing novolac epoxy (DOPO-HQ-CNE) of composite (A) and the bisphenol—A novolac epoxy resin of composite (A) is 2 and the composition results in the increasing of moisture absorption and the decreasing of Tg of prepregs/substrates. On the other hand, the result of the anti-flammability is marked as V-1 (i.e., not acceptable) when the weight ratio of the first phosphorus-containing novolac epoxy and the second phosphorus-containing novolac epoxy of composite (A) and the bisphenol—A novolac epoxy resin of composite (A) is 0.5 in Test 6. Therefore, lower amount of the phosphorus-containing novolac epoxy (i.e., the sum of the first and the second phosphorus-containing novolac epoxy) results in the decreasing of the anti-flammability of prepregs/substrates. Higher amount of the phosphorus-containing novolac epoxy (i.e., the sum of the first and the second phosphorus-containing novolac epoxy) results in the increasing of the moisture absorption of prepregs/substrates.

In Embodiments 1, 4, 5, the weight ratios of the first phosphorus-containing novolac epoxy and the second phosphorus-containing novolac epoxy of composite (A) and the bisphenol—A novolac epoxy resin of composite (A) are respectively 1, 1.4, 0.72. The compositions of the three embodiments in Table. 2 result in the improvement of the toughness of prepregs/substrates. The moisture absorption is controlled from 0.16 to 0.17 and the results of the anti-flammability are marked as V-0. Accordingly, when the weight ratio of the first phosphorus-containing novolac epoxy and the second phosphorus-containing novolac epoxy of composite (A) and the bisphenol—A novolac epoxy resin of composite (A) is from 0.72 to 1.4, the properties of moisture absorption, anti-flammability, toughness, and Tg of prepregs/substrates are improved. Furthermore, the weight ratio of the first phosphorus-containing novolac epoxy and the second phosphorus-containing novolac epoxy of composite (A) and the bisphenol—A novolac epoxy resin of composite (A) is preferably 1 according to the experimental result in Embodiment 1.

According to the data in Tables.1 and 2, the resins of the Embodiments 1-5 have DOPO-doped, DOPO-HQ-doped compositions, the reactivity and the heatproof of the manufactured prepregs/substrates are improved. With regard to the lamination process of FR4 (i.e., lamination temperature is above 195° C. and lamination time is above 30 minutes), the compositions used in Embodiments 1-5 can increase the reaction and connection of resin because the Tg of the substrate increases to 175° C. On the other hand, the amount of DOPO-CNE and DOPO-HQ-CNE are discussed and controlled to improve the toughness of the manufactured prepregs/substrates and the results of the anti-flammability of prepregs/substrates are marked in highest level of UL 94 V-0.

A method for manufacturing a prepreg using the varnish is disclosed in the present invention. The varnish is provided and the varnish has composition (A): resin wherein the resin has a bisphenol—A novolac epoxy resin, a first phosphorus-containing novolac epoxy and a second phosphorus-containing novolac epoxy; and composition (B): curing agent, wherein the curing agent includes a benzoxazine resin and a phenol novolac resin. The varnish further has composition (C): flame-retarding agent which can be an aryl condensed phosphate. Composition (D) is an accelerator and composition (E): filler which includes aluminium hydroxide, silica, or mixture of aluminium hydroxide and silica. Composition (F) is a solvent. The glass fabrics are dipped into the varnish so as to manufacture a prepreg, PP, or copper clad laminate (CCL) with good heatproof and anti-flammability properties. The above-mentioned prepregs are applied for manufacturing the substrate of PCB, and the substrate has improved reactivity in the lamination process.

In summary, the present invention has the following advantages.

1. Two kinds of phosphorus-containing novolac epoxy are mixed with a bisphenol—A novolac epoxy resin as a composite epoxy resin. The composite epoxy resin is distributed in the halogen-free varnish so as to improve the anti-flammability, low moisture absorption, and heatproof property of prepreg which is made by dipping glass fabrics into the varnish. Furthermore, the toughness of the substrate laminated by the prepregs can be improved.

2. The varnish of the present invention contain a composite curing agent with benzoxazine resin and a phenol novolac resin and the composite curing agent can be used for improving electric property of the prepreg and the peeling strength of the lamination.

The above-mentioned descriptions represent merely the preferred embodiment of the present invention, without any intention to limit the scope of the present invention thereto. Various equivalent changes, alternations, or modifications based on the claims of present invention are all consequently viewed as being embraced by the scope of the present invention.

What is claimed is:

1. A halogen-free varnish, comprising:
A) composition (A): a resin, wherein the resin includes a bisphenol-A novolac epoxy resin, a first phosphorus-containing novolac epoxy and a second phosphorus-containing novolac epoxy,
wherein the first phosphorus-containing novolac epoxy is a side-chain phosphorus-containing novolac epoxy,
wherein the first phosphorus-containing novolac epoxy is a novolac epoxy resin linked with an organic ring in which one vertex of the ring is occupied, or formed by a phosphorus atom,
wherein the first phosphorus-containing novolac epoxy is an o-cresol novolac epoxy resin linked with 9,10-dihydro-9-oxa-10-phosphaphenanthrene-10-oxide, and the 9,10-dihydro-9-oxa-10-phosphaphenanthrene-10-oxide is shown as formula 1,

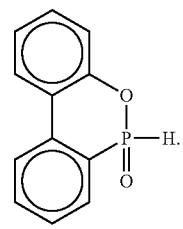

formula 1 wherein the second phosphorus-containing novolac epoxy is a novolac epoxy resin linked with an organic ring in which one vertex of the ring is occupied, or formed by a phosphorus atom,
wherein the second phosphorus-containing novolac epoxy is an o-cresol novolac epoxy resin linked with formula 2, formula 2

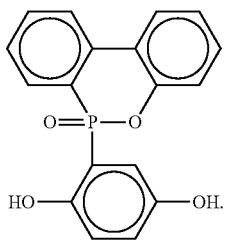

wherein the weight ratio of the combined first phosphorus-containing novolac epoxy and the second phosphorus-containing novolac epoxy of composition (A) to the bisphenol-A novolac epoxy resin of composition (A) ranges from 0.72 to 1.4;

B) composition (B): a curing agent, wherein the curing agent includes a benzoxazine resin and a phenol novolac resin;

C) composition (C): a flame-retarding agent;

D) composition (D): an accelerator; and

E) composition (E): fillers.

2. The halogen-free varnish according to claim 1, wherein the weight ratio of the combined first phosphorus-containing novolac epoxy and the second phosphorus-containing novolac epoxy of composition (A) to the bisphenol-A novolac epoxy resin of composition (A) is equal to 1.

3. The halogen-free varnish according to claim 2, wherein the weight ratio of the first phosphorus-containing novolac epoxy to the second phosphorus-containing novolac epoxy ranges from 0.25 to 0.68.

4. The halogen-free varnish according to claim 3, wherein the weight ratio of the first phosphorus-containing novolac epoxy to the second phosphorus-containing novolac epoxy ranges from 0.29 to 0.43.

5. The halogen-free varnish according to claim 4, wherein the benzoxazine resin of composition (B) is formula 3, formula 3

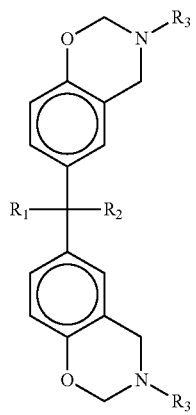

wherein $R_1$, $R_2$ are methyl or ethyl, $R_3$ is a benzene ring, methyl or ethyl.

6. The halogen-free varnish according to claim 5, wherein the flame-retarding agent of composition (C) is a phosphorus-containing epoxy.

7. The halogen-free varnish according to claim 6, wherein the phosphorus-containing epoxy is an aryl condensed phosphate.

8. The halogen-free varnish according to claim 1, wherein composition (E) includes aluminum hydroxide, or silica, or a mixture of aluminum hydroxide and silica.

9. The halogen-free varnish according to claim 1, further comprising composition (F) of solvents, wherein the composition (F) has one of or more than one of methyl ethyl ketone, propylene glycol monomethyl ether, and cyclohexanone.

10. A prepreg being manufactured by dipping glass fabrics into the varnish of claim 1.

11. A substrate of printed circuit board being manufactured by laminating the prepreg of claim 10.

* * * * *